United States Patent
Maggay

(10) Patent No.: US 11,929,542 B2
(45) Date of Patent: Mar. 12, 2024

(54) SPUTTERED SIP ANTENNA

(71) Applicant: Analog Devices International Unlimited Company, Limerick (IE)

(72) Inventor: Romulo Maggay, Cavite (PH)

(73) Assignee: Analog Devices International Unlimited Company, Limerick (IE)

(*) Notice: Subject to any disclaimer, the term of this patent is extended or adjusted under 35 U.S.C. 154(b) by 490 days.

(21) Appl. No.: 17/218,084

(22) Filed: Mar. 30, 2021

(65) Prior Publication Data

US 2021/0218126 A1    Jul. 15, 2021

Related U.S. Application Data

(62) Division of application No. 16/132,786, filed on Sep. 17, 2018, now Pat. No. 10,978,779.

(51) Int. Cl.
| | |
|---|---|
| *H01Q 1/22* | (2006.01) |
| *H01L 23/498* | (2006.01) |
| *H01L 23/66* | (2006.01) |
| *H01Q 1/38* | (2006.01) |
| *H01Q 1/40* | (2006.01) |
| *H01Q 9/04* | (2006.01) |
| *H01Q 23/00* | (2006.01) |

(52) U.S. Cl.
CPC ..... *H01Q 1/2283* (2013.01); *H01L 23/49822* (2013.01); *H01L 23/66* (2013.01); *H01Q 1/38* (2013.01); *H01Q 1/40* (2013.01); *H01Q 9/0407* (2013.01); *H01Q 23/00* (2013.01); *H01L 2223/6677* (2013.01)

(58) Field of Classification Search
CPC ......... H01L 2223/6677; H01Q 1/2283; H01Q 1/40; H01Q 23/00; H01Q 9/0407
See application file for complete search history.

(56) References Cited

U.S. PATENT DOCUMENTS 6,818,985 B1    11/2004    Coccioli et al.
7,408,512 B1    8/2008    Rodenbeck et al.
(Continued)

OTHER PUBLICATIONS

Ali, Advanced 5G Substrates with Integrated Antennas, Thesis presented to the Academic Faculty of the George Institute of Technology, May 2017, 120 pages.
(Continued)

*Primary Examiner* — Raj R Gupta
(74) *Attorney, Agent, or Firm* — Knobbe, Martens, Olson & Bear, LLP

(57) ABSTRACT

System in package (SiP) modules are compact packages that include components such as processors, memory, sensors, and passive components on a single substrate. One low cost and compact way to integrate an antenna into a SiP module is to suspend an antenna in molding compound so that the antenna is embedded in the real estate of the molding compound layer. To embed the antenna, the molding compound is first deposited. A cavity can be cut in the molding compound to hold the antenna. The cavity can be filled with conductive material to form the antenna. Further molding compound can be deposited to cover the antenna and enclose the antenna in the molding compound layer. Ground structures can also be suspended in the molding compound. Such an embedded antenna can be particularly useful for radio applications.

20 Claims, 19 Drawing Sheets

(56) References Cited

U.S. PATENT DOCUMENTS

| | | | |
|---|---|---|---|
| 9,899,341 | B2 | 2/2018 | Hashemi et al. |
| 10,978,779 | B2 | 4/2021 | Maggay |
| 2007/0026567 | A1 | 2/2007 | Beer et al. |
| 2008/0029886 | A1 | 2/2008 | Cotte et al. |
| 2009/0289343 | A1 | 11/2009 | Chiu et al. |
| 2010/0193935 | A1 | 8/2010 | Lachner et al. |
| 2012/0062439 | A1* | 3/2012 | Liao ............... H01L 25/16 29/25.01 |
| 2013/0321238 | A1 | 12/2013 | Okano |
| 2018/0151518 | A1* | 5/2018 | Shen ............... H01L 23/3135 |
| 2020/0066663 | A1* | 2/2020 | Aleksov ........... H01L 23/5389 |

OTHER PUBLICATIONS

Breed, An Introduction to Defected Ground Structures in Microstrip Circuits, Nov. 2008, High Frequency Electronics, Summit Technical Medial, LLC., 3 pages.

Chen et al., Electromechanically Tunable Suspended Optical Nano-antenna, Letter in Nano Lett., 2016, 20 pages [manuscript retrieved from https://arxiv.org/ftp/arxiv/papers/1602/1602.00179.pdf on May 21, 2018].

Cheng, Integrated Antenna Solutions for Wireless Sensor and Millimeter-Wave Systems, Digital Comprehensive Summaries of Uppsala Dissertations from the Faculty of Science and Technology 698, Uppsala Universitet, 2009, 978-91-554-7681-6, 116 pages.

Kam et al., Low-Close Antenna-in-Package Solutions for 60-GHz Phased-Array Systems, 978-1-4244-6867-6/10 2010 IEEE, 5 pages.

Lee, A Highly Integrated and Comprehensive SiP Solutions for IoT, Semicon® Southeast Asia, retrieved from http://www.semi.org/en/sites/semi.org/files/data15/docs/TIF_Teck_LEE_ASE.pdf on May 21, 2018, 15 pages.

Zhang et al., Antenna-on-Chip and Antenna-in-Package Solutions to Highly Integrated Millimeter-Wave Devices for Wireless Communications, Article in IEEE Transactions on Antennas and Propagation, Nov. 2009, 14 pages.

3D Integration and Packaging of mmWave Circuits and Antennas: Opportunities and Challenges, Signal Integrity Journal, Feb. 12, 2016, 8 pages.

\* cited by examiner

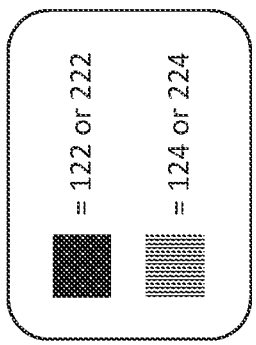
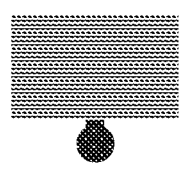
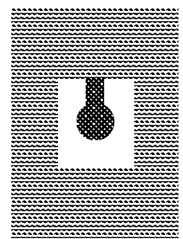
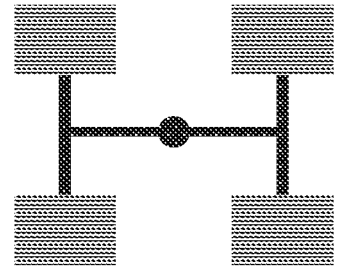
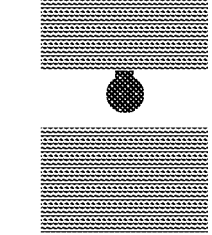
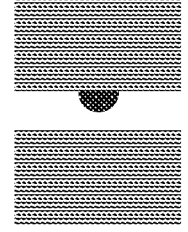
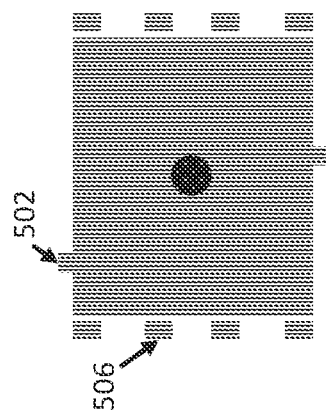
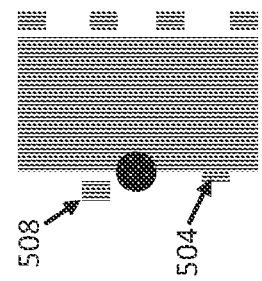

SPUTTERED SIP ANTENNA

PRIORITY DATA

This application is a Divisional Application of U.S. patent application Ser. No. 16/132,786, filed on Sep. 17, 2018, and titled "SPUTTERED SIP ANTENNA," the disclosure of which is hereby incorporated by reference herein in its entirety.

TECHNICAL FIELD OF THE DISCLOSURE

The present disclosure relates to the field of integrated circuits, in particular to packaging an antenna in a system in package (SiP) module.

BACKGROUND

System in package (SiP) modules is a three-dimensional packaging technique to incorporate many components into one module or package. Specifically, components such as processors, memories, sensors, and passive components (e.g., inductors, resistors, and capacitors) can be mounted on a single substrate that supports a SiP module. SiP modules can stack dies (having integrated circuits) vertically and/or horizontally. The ability to integrate many components into a single module makes SiP modules particularly attractive for small electronic devices such as mobile phones, smart devices, wearables, and Internet of Things devices. SiP modules' highly integrated design obviates the need to include many external components and can reduce the complexity of the overall system and bill of materials. SiP modules are typically fabricated using a mix of packaging technologies.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 5A-H illustrate various radiating structures and feedline configurations, according to some embodiments of the disclosure;

DESCRIPTION OF EXAMPLE EMBODIMENTS OF THE DISCLOSURE

Overview

System in package (SiP) modules are compact packages that include components such as processors, memory, sensors, and passive components on a single substrate. One low cost and compact way to integrate an antenna into a SiP module is to suspend an antenna in molding compound so that the antenna is embedded in the real estate of the molding compound layer. To embed the antenna, the molding compound is first deposited. A cavity can be cut in the molding compound to hold the antenna. The cavity can be filled with conductive material to form the antenna. Further molding compound can be deposited to cover the antenna and enclose the antenna in the molding compound layer. Ground structures can also be suspended in the molding compound. Such an embedded antenna can be particularly useful for radio applications.

Antennae for Radio Applications

Wireless devices are common in a wide range of application areas, such as consumer, medical, industrial, military, etc. Radio frequency communications are used often in these wireless devices and communication base stations providing data access to those wireless devices. To enable wireless communications, the wireless devices would typically include a system of components such as baseband subsystem/processor, receivers, transmitters, and antennae. The spectrum used can depend on the communication protocol. Several recent communication protocols uses millimeter wave (mmWave) radios covering high gigahertz spectrum (e.g., 30 GHz-300 GHz). The mmWave radios and protocols are specially targeted to devices using point-to-point communications (e.g., vehicular communications, Internet of Things communications, local area networks, internet access, etc.) and even 5G mobile phones. Shorter wavelengths mean that antennae are smaller. Integrating antennae into a system is not trivial.

Suspending an Antenna in the Molding Compound Layer

One technical task of integrating an antenna with a radio system is to include an antenna with the radio system at low cost. The insight to performing this technical task is to make use of the area within one or more molding compound layers to embed a low cost, small antenna within a SiP module. The antenna can be formed through a sputtering process to reduce cost and conductor volume. As a result, the overall SiP fabrication cost can be reduced as well.

Figure 1:
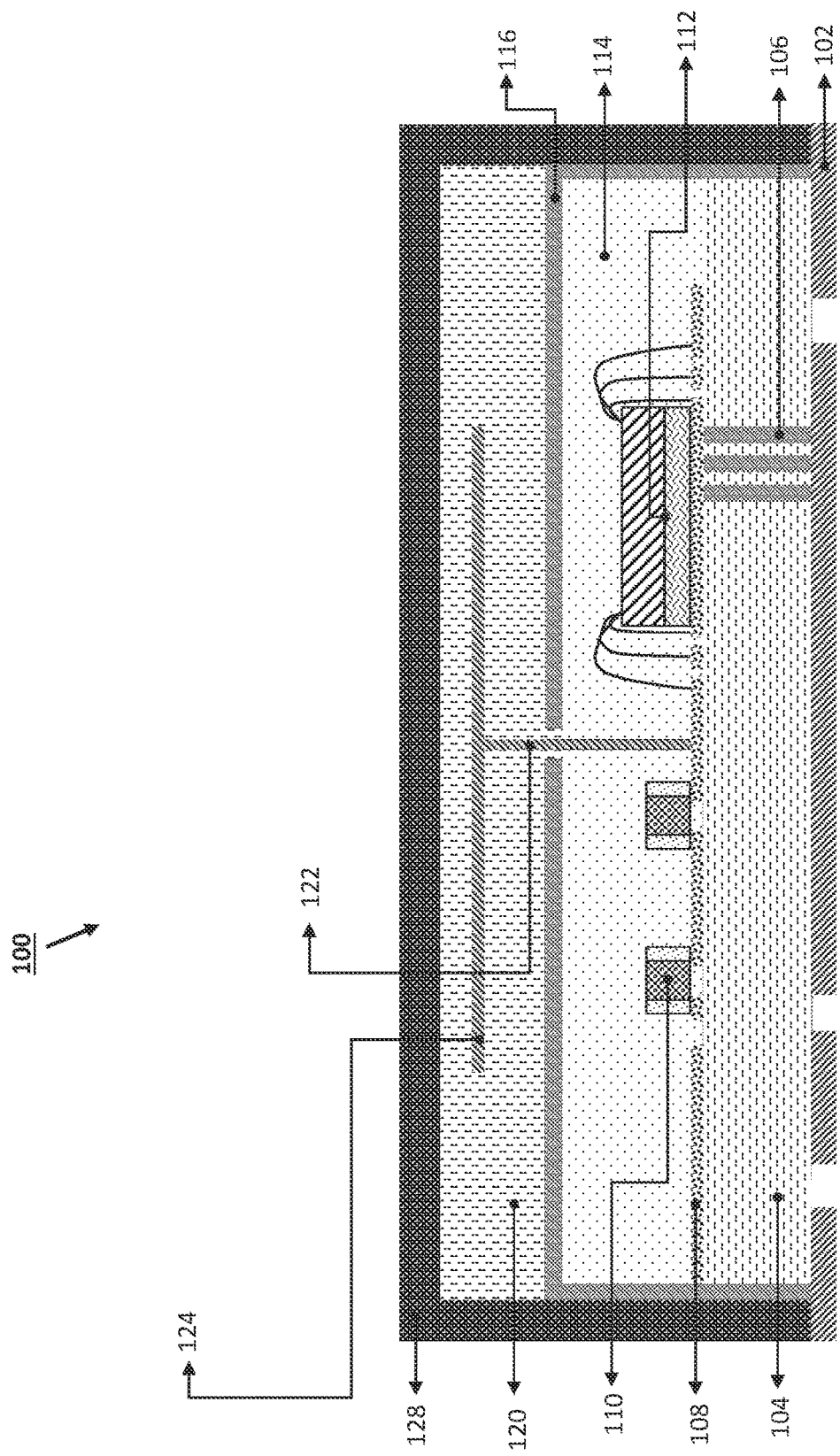
FIG. 1 illustrates an antenna enclosed in molding compound and conformal overmold compound of a SiP module, according to some embodiments of the disclosure.
Figure 2:
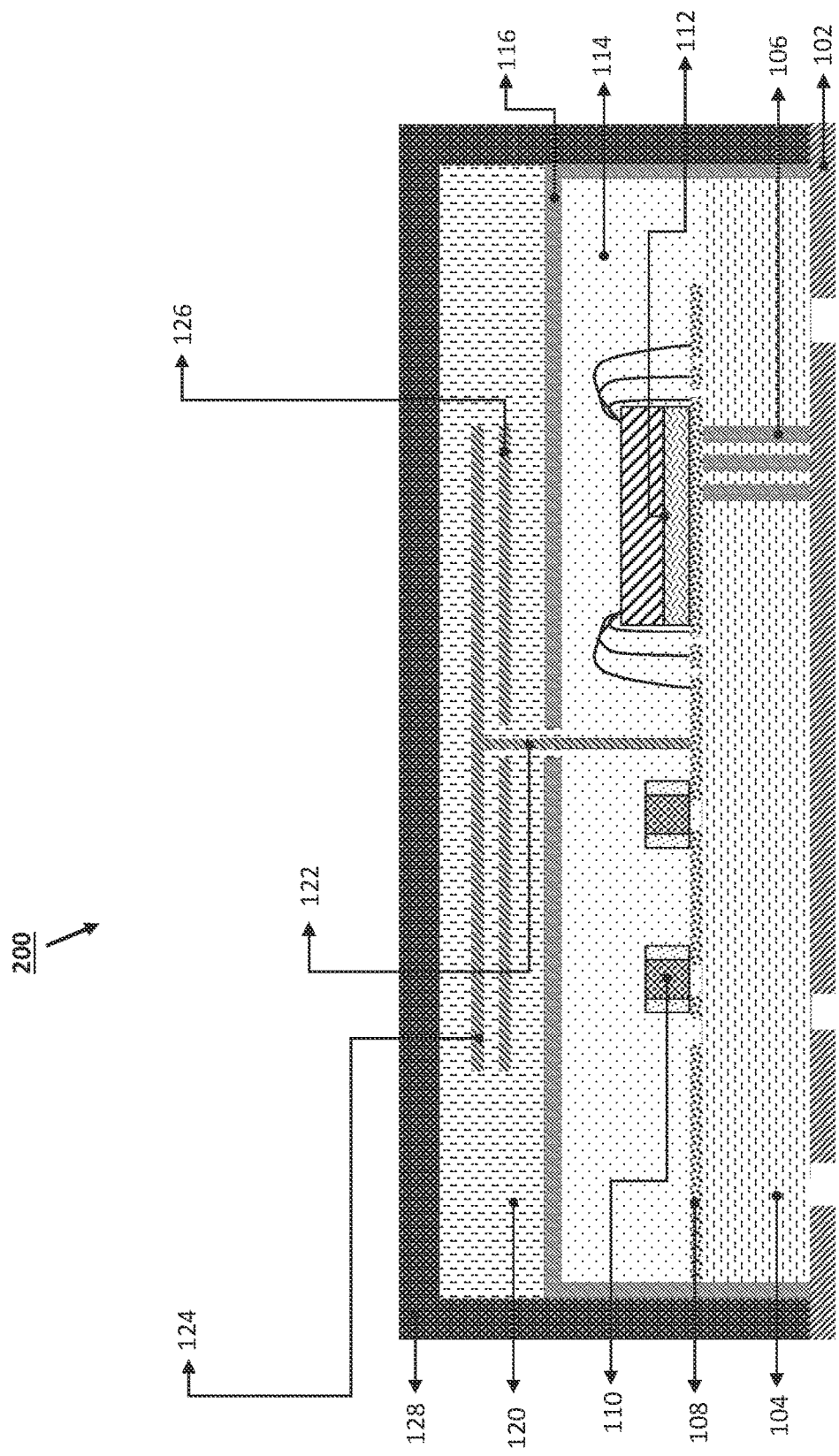
FIG. 2 illustrates an antenna enclosed in molding compound and conformal overmold compound and ground structures enclosed in the molding compound of a SiP module, according to some embodiments of the disclosure.
Figure 3:
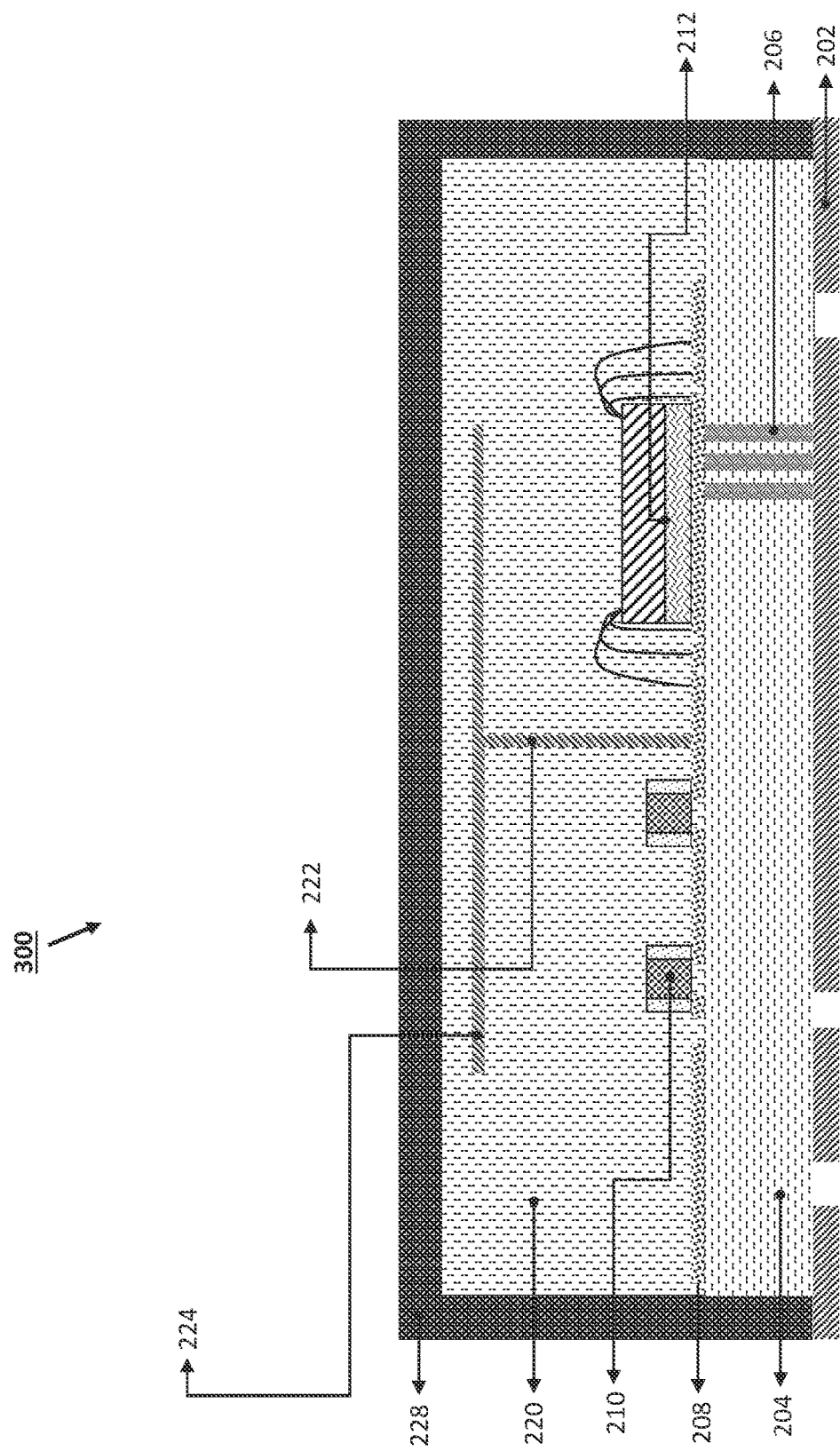
FIG. 3 illustrates an antenna enclosed in molding compound of a SiP module, according to some embodiments of the disclosure.
Figure 4:
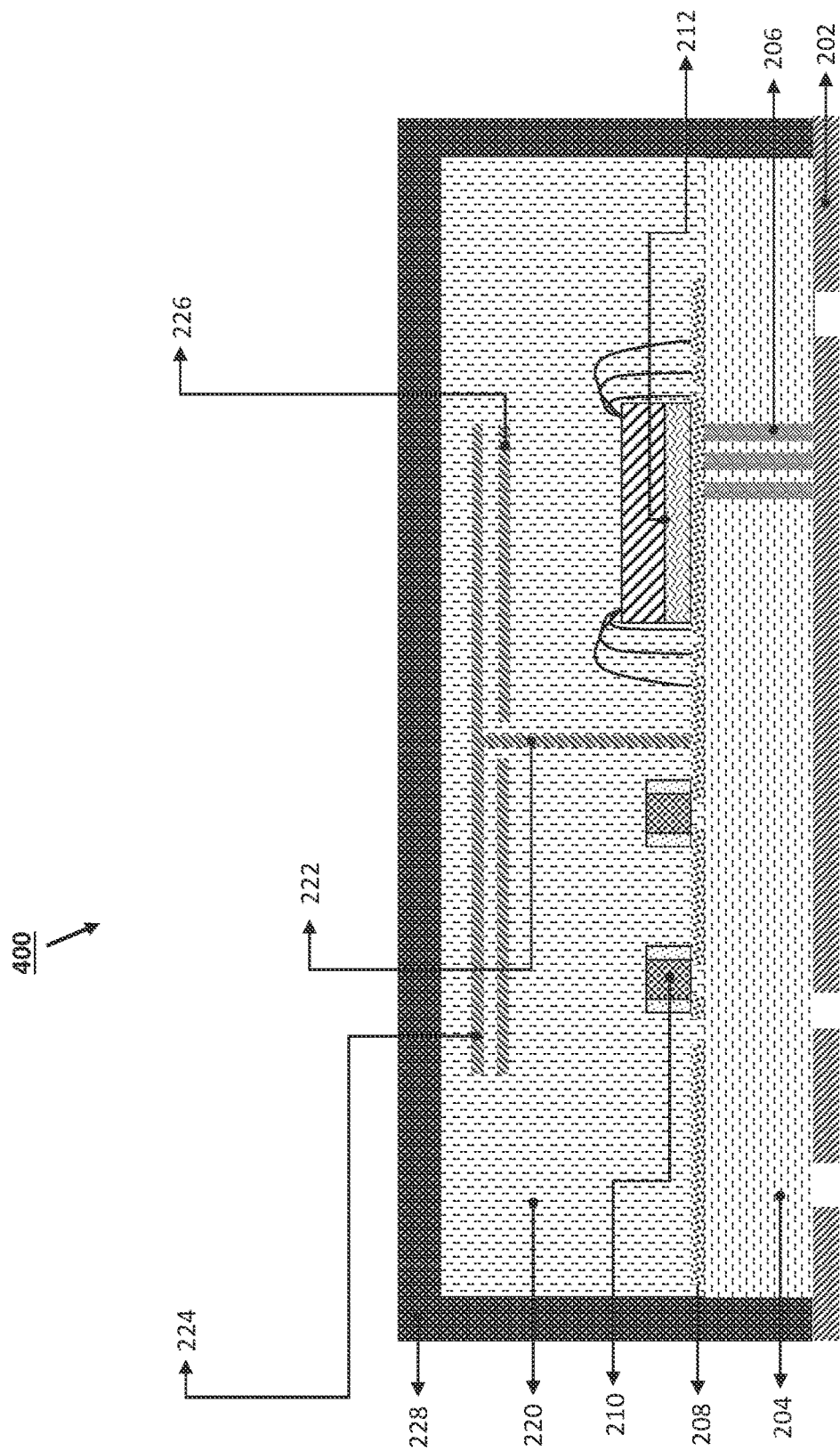
FIG. 4 illustrates an antenna and ground structures enclosed in molding compound of a SiP module, according to some embodiments of the disclosure.

The following passages describe some exemplary structures where the antenna is enclosed by molding compound. For instance, the antenna can be embedded/suspended in a molding compound layer of the SiP module. FIGS. 1 and 2 are based on exemplary SiP modules with conformal-based shielding and package enclosure. FIGS. 3 and 4 are based on exemplary SiP modules with package enclosure. FIGS. 1-4 are cross sectional views of the exemplary SiP modules.

FIG. 1 illustrates an antenna enclosed in molding compound and conformal overmold compound of a SiP module, according to some embodiments of the disclosure. 102 is ground. 104 is the substrate of the SiP module. The substrate 104 preferably provides rigidity and is generally non-conductive. The substrate 104 forms a base for other layers and components to be put on top of the substrate to form the SiP module 100. The substrate 104 can be made from organic laminate, ceramic, glass, etc. 106 is a vertical electrical connection (e.g., vertical electrical interconnect access or via) passing through the substrate 104.

108 is a component layer. The component layer 108 can include one or more metal layers (e.g., made of copper or other suitable conductive material) serving as (lateral) electrical interconnections for the components in the SiP module 100. 110 is one of the one or more passive components mounted on the component layer 108. 112 is a component, such as a chip or die, also mounted on the component layer. Generally speaking, the components such as 110 and 112 and any other suitable component (processors, memories, sensors, and passive components) can be mounted on the component layer 108 and placed horizontally on the component layer 108. Some components can be vertically stacked within a SiP module.

114 is a conformal overmold compound. Conformal overmold compound 114 can be added by injecting a suitable compound (with some pressure, likely low pressure) or pouring the suitable compound into a mold to cover/enclose/seal surfaces of the component layer 108 and the one or more components with the compound, and subsequently curing the compound. Layer formed by the conformal overmold compound 114 can provide mechanical protection for the components and the component layer 108. Layer formed by the conformal overmold compound 114 can also serve as a shield against undesirable environmental interferences such as moisture. The conformal overmold compound 114 can, if desired, conform with the contours of the one or more components on mounted on the component layer. In some cases, the conformal overmold compound 114 can be replaced by a conformal coating. The layer covering/enclosing/sealing the one or more components can be formed by applying a conformal coating. 116 is a conformal shield. Conformal shield 116 can provide electromagnetic interference shielding and/or radio frequency interference shielding for the one or more components mounted on the component layer. A coating can be deposited, painted, sprayed, or sputtered onto the conformal overmold compound 114 to form the conformal shield 116. The conformal shield 116 is generally conductive, and can be made from materials such as copper or silver. The conformal shield 116 can enclose surfaces of the substrate 104, component layer 108, and conformal overmold compound 114. The conformal shield 116 may not enclose/cover entire surfaces of the conformal overmold compound 114.

120 is (package) molding compound forming a (package) molding compound layer. The molding compound 120 is deposited/applied over the conformal shield 116 (and any areas of the conformal overmold compound 114 not covered by the conformal shield 116). The molding compound 120 can be injected (with some pressure) into a mold and subsequently cured. The molding compound layer can provide mechanical protection for the SiP module 100. The molding compound layer can also provide chemical protection for the SiP module 100. The molding compound 120 can be made from several materials such as one or more of the following: organic resin, inorganic materials, catalysts for curing, mold release material, and colorant.

128 is packaging enclosure material. The packaging enclosure material 128 can be made of plastic or ceramic. The packaging enclosure material 128 preferably encloses surfaces of conformal shield 116, and molding compound 120. The packaging enclosure material 128 can form the final layer that protects the SiP module 100 and serve as the outermost protection barrier.

Accordingly, SiP module 100 has various layers, such as a ground layer, a layer formed by substrate 104, a component layer 108, a layer formed by conformal overmold compound 114, a conformal shield layer, a layer formed by packaging molding compound 120, a layer formed by packaging enclosure material 128, etc.

Moreover, the SiP module 100 has an antenna that is connected to the component layer 108 and is enclosed by one or more molding compound layers. The antenna has a radiating structure 124 and a feedline 122 connecting the radiating structure 124 to the component layer 108. The antenna is embedded or suspended in the one or more molding compound layers, e.g., the layer formed by conformal overmold compound 114, and the layer formed by molding compound 120. The antenna is formed using a conductive material (e.g., copper, silver, aluminum, etc.). In some cases, the antenna is formed from a metal, or a combination of metals, such as metal alloys. In some cases, the antenna is formed from a magnetic material. Generally speaking, the antenna can be formed from a material suitable for sensing electromagnetic waves and/or emitting electromagnetic waves.

In the case of SiP module 100, the antenna radiating structure is enclosed within molding compound 120 (or the layer formed by the molding compound 120). The antenna radiating structure 124 can have a thin planar profile/shape, which spans horizontally within the SiP module 100 to form a patch antenna. The shape and area of the antenna radiating structure 124 and number of structures can vary depending on the application, the desired antenna design, available area in the layer formed by the molding compound 120, and physical limitations for fabricating/forming the antenna radiating structure 124.

The antenna feedline 122 is enclosed within molding compound 120 and conformal overmold compound 114 (or the layer formed by molding compound 120 and the layer formed by conformal overmold compound 114). The antenna feedline 122 thus extends (vertically) from the layer formed by molding compound 120 through the layer formed by conformal overmold compound 114 to the component layer 108. The antenna feedline 122 is substantially vertical or may have some parts which are not vertical. The physical layout of the antenna feedline 122 connecting the antenna radiating structure 124 to the component layer 108 can depend on the application, the desired antenna design, available area in the layer formed by the molding compound 120, and physical limitations for fabricating/forming the antenna feedline 122.

Accordingly, the antenna, via the antenna feedline 122, can be connected to other components mounted on the component layer 108. For instance, the antenna can be connected to radio front-end electrical components/integrated circuits for controlling the antenna and/or processing signals from the antenna.

The conformal shield 116 is not connected to (or does not contact) the antenna feedline 122. Advantageously, the conformal shield 116 can serve as a ground structure for the antenna. In other words, the conformal shield 116 can be a ground plane for the antenna. The conformal shield 116 can also shield the one or more components in the SiP module 100 from undesirable interference radiating from the antenna.

FIG. 2 illustrates an antenna and ground structures enclosed in molding compound and conformal overmold compound of a SiP module 200, according to some embodiments of the disclosure. Specifically, SiP module 200 is different from SiP module 100 in that SiP module 200 has one or more (optional) antenna ground structures 126 enclosed in one of the molding compound layers, i.e., the layer formed by molding compound 120. The antenna ground structures 126 can serve as a ground plane for the antenna, and is not connected to the antenna. The antenna ground structures 126 can be fabricated in a location under (away from the intended radiating direction of the antenna radiating structure 124) and/or adjacent to the antenna radiating structure 124. The material forming the antenna ground structures 126 is conductive.

The shape, size, and number of antenna ground structures 126 can depend on the application, the desired antenna design, available area in the layer formed by the molding compound 120, and physical limitations for fabricating/forming the antenna ground structures 126. The antenna ground structures 126 can substantially span/match the shape/boundary of the antenna radiating structure 124. In some cases, the antenna ground structures 126 can span beyond the area/boundary of the antenna radiating structure 124. In some cases, the antenna ground structures 126 can span a smaller area than the area of the antenna radiating structure 124. In some cases, the antenna ground structures 126 can have a contiguous shape. In some cases, the antenna ground structures 126 can include multiple segmented ground structures. In some cases, the antenna ground structures have one or more defected ground structures. Slots/defects/shapes can be included strategically for the defected ground structures to achieve a certain set of antenna parameters (e.g., bandwidth, gain, suppression of mutual coupling, etc.).

FIG. 3 illustrates an antenna enclosed in molding compound of a SiP module 300, according to some embodiments of the disclosure. SiP module 300 is similar to SiP module 100 of FIG. 1, with the exception that there is no conformal overmold compound and no conformal shield. 202 is ground. 204 is the substrate of the SiP module (similar to substrate 104 of FIG. 1). 206 is a vertical electrical connection (similar to substrate 106 of FIG. 1). 208 is a component layer (similar to component layer 108 of FIG. 1). 210 is one of the one or more passive components mounted on the component layer (similar to the one or more passive components 110 of FIG. 1). 212 is a component, such as a chip or die, also mounted on the component layer (similar to component 112 of FIG. 1). 220 is (package) molding compound forming a (package) molding compound layer (similar to molding compound 120 of FIG. 1). The molding compound 220 is deposited/applied over the one or more components and the component layer 208 and encloses surfaces of the one or more components and the component layer 208. The molding compound 220 can be injected (with some pressure) into a mold and subsequently cured. The molding compound layer can provide mechanical protection for the one or more components in SiP module 300. The molding compound layer can also provide chemical protection for the SiP module 300. 228 is packaging enclosure material (similar to packaging enclosure material 128 of FIG. 1). The packaging enclosure material 228 preferably encloses surfaces of molding compound 220, the component layer 208, and substrate 204. The packaging enclosure material 228 can form the final layer that protects the SiP module 300 and serve as the outermost protection barrier. Accordingly, SiP module 300 has various layers, such as a ground layer, a layer formed by substrate 204, a component layer 208, a layer formed by packaging molding compound 220, a layer formed by packaging enclosure material 228, etc.

Moreover, the SiP module 300 has an antenna, similar to the antenna illustrated in FIGS. 1 and 2, which is connected to the component layer 208 and is enclosed by a layer formed by packaging molding compound 220. The antenna has a radiating structure 224 and a feedline 222 connecting the radiating structure 224 to the component layer 208. The antenna is embedded or suspended in the layer formed by packaging molding compound 220. The radiating structure 224 is similar to the radiating structure 124 of FIG. 1. The feedline 222 is similar to the feedline 122, with the exception that the feedline 222 is enclosed within molding compound 120 (no conformal overmold compound 114 is present). The antenna feedline 222 thus extends (vertically) from the layer formed by molding compound 220 to the component layer 208.

FIG. 4 illustrates an antenna enclosed in molding compound and conformal overmold compound and ground structures enclosed in the molding compound of a SiP module 400, according to some embodiments of the disclosure. Specifically, SiP module 400 is different from SiP module 300 in that SiP module 400 has one or more (optional) antenna ground structures 226 enclosed in one of the molding compound layers, i.e., the layer formed by molding compound 220. The antenna ground structures 226 are similar to the antenna ground structures 126 of FIG. 2.

Various Examples of Radiating Structures

FIGS. 5A-H illustrate various radiating structures (e.g., 124 and 224) and feedline (e.g., 122, and 222) configurations, according to some embodiments of the disclosure. FIGS. 5A-H are top views of the antenna, omitting any molding compound enclosing the antenna. FIGS. 5A-H are intended to illustrate some exemplary antenna designs and are not intended to be limiting. Specifically, FIGS. 5A-H illustrate a variety of possible radiating structures.

FIG. 5A show a rectangular patch as the radiating structure. FIG. 5B shows a rectangular patch as the radiating structure with a rectangular opening in the center of the rectangular patch. FIG. 5C shows a rectangular patch as the radiating structure, where the radiating structure is offset from the feedline. FIG. 5D show an antenna having two radiating structures. FIG. 5F also shows an antenna having two radiating structures. The two radiating structures of an antenna form a dipole antenna. FIG. 5E show an antenna having four radiating structures. The four radiating structures of an antenna form a quadrupole antenna. Depending on the desired radiating pattern to be achieved, the radiating structure can have a suitable array of patches. The desired radiating pattern would depend on the application. FIG. 5G shows an antenna having a radiating structure that includes one or more parasitic conductive elements. FIG. 5H also shows an antenna having a radiating structure that includes one or more parasitic conductive elements. The parasitic conductive elements can extend from the radiating structure, such as parasitic conductive element 502 and parasitic conductive element 504. As an example, the parasitic conductive elements are rectangular in shape. The parasitic conductive elements can be adjacent to the radiating structure, such as parasitic conductive element 506 and parasitic conductive element 508. The parasitic conductive elements adjacent to the (main) radiating structure do not contact the (main) radiating structure. The shape, size, and placement of the parasitic conductive elements can enable proper loading, matching, and other desirable antenna behavior.

Two-Step Molding Process for Embedding an Antenna in the Molding Compound Layer

As illustrated by FIGS. 1-4, the radiating structure of the antenna is embedded and enclosed within the packaging molding compound layer of the SiP, and a feedline connects the radiating structure to a component layer of the SiP module. Specifically, the feedline runs through at least a molding compound layer to reach the component layer. To fabricate an antenna radiating structure enclosed within the molding compound layer and the feedline that connects the radiating structure to the component is not trivial. The fabrication process results in an antenna that is suspended within the molding compound layer and does not sit on top of the molding compound layer.

The technical task is how to embed a low cost small antenna structure within SiP modules, and have the antenna suspended in the molding compound layer. The fabrication process includes at least a two-step molding process. Molding compound is deposited. Then, appropriate cavities are cut within the molding compound, or certain amounts and areas of the molding compound are removed. An antenna can be embedded in the cavities, e.g., by filling the cavities with a conductive material, to form the antenna. Further molding compound is deposited to enclose the embedded antenna (and to reach a desired package thickness).

Some of the steps can be adjusted, in some applications, to achieve a desired geometry of the antenna. Moreover, the steps can be augmented with additional molding and cutting steps, if the optional antenna ground structures are to be included. Furthermore, the steps can be adjusted (e.g., the cutting and filling steps) if there are multiple molding compound layers in the SiP module.

Exemplary Method to Embed an Antenna

FIGS. 6-10 illustrate steps to embed an antenna, according to some embodiments of the disclosure. FIG. 11 is a flow diagram illustrating a method to embed an antenna (including the steps illustrated in FIGS. 6-10), according to some embodiments of the disclosure. The exemplary fabrication steps being illustrated are used for fabricating the antenna seen in FIG. 3. The steps begin after the components have been mounted onto the component layer.

Figure 6:
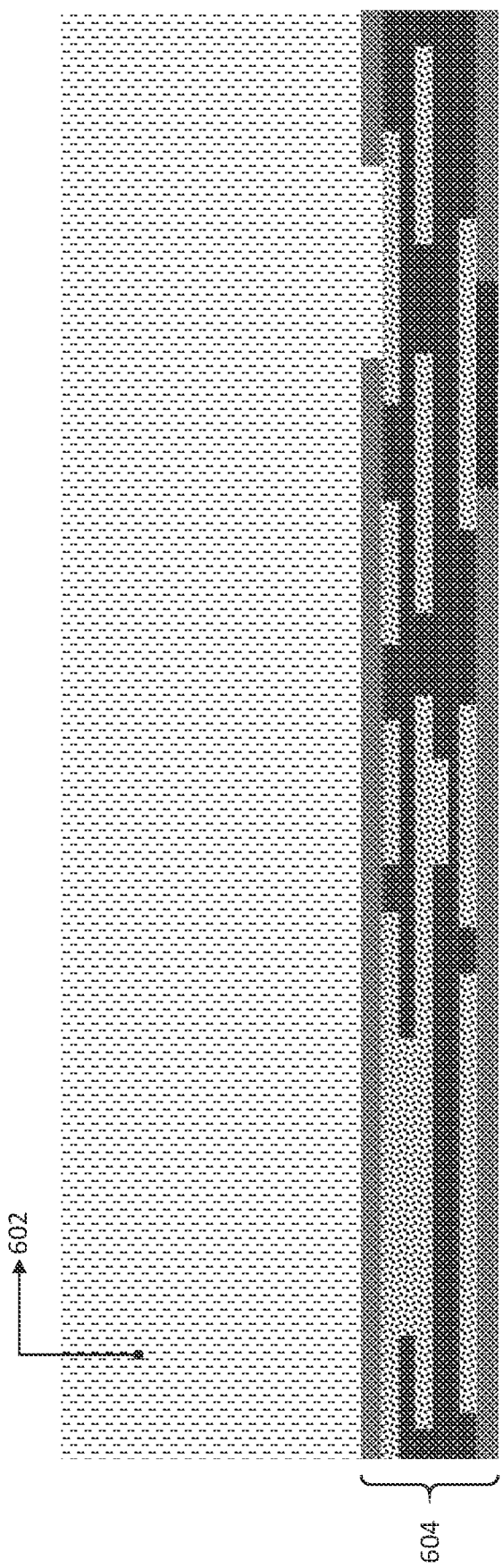
FIGS. 6-10 illustrate steps to embed an antenna, according to some embodiments of the disclosure.

FIG. 6 shows a component layer 604, and a packaging molding compound 602 of a SiP module. The package molding compound 602 is deposited onto the component layer 604 and one or more components (not shown) mounted on the component layer 604 (1102 of FIG. 11). The partial SiP module is placed in a mold, and the package molding compound 602 can be injected into the mold to fill the mold and seal the partial SiP module. Other means for depositing the package molding compound 602 can be used.

Figure 7:
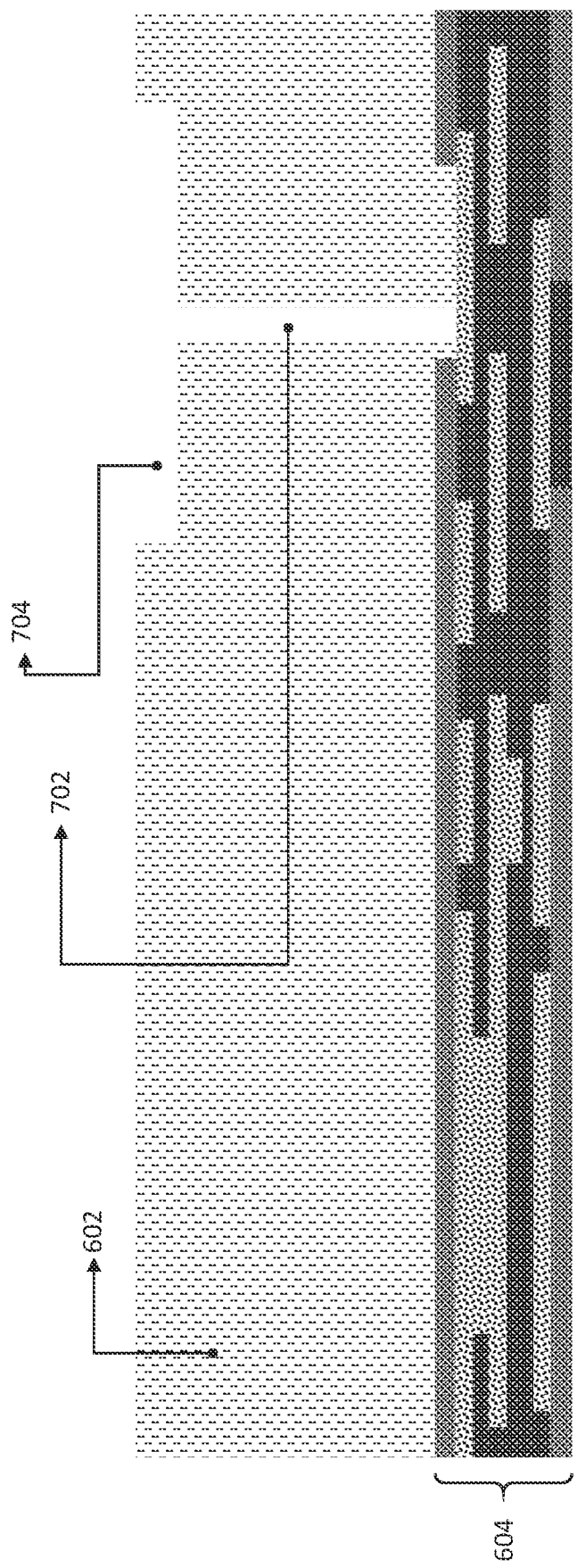

FIG. 7 shows a cavity having two portions: a portion 702 to hold a feedline and a portion 704 to hold a radiating structure. The cavity is cut in at least a layer formed by the package molding compound 602 (1104 of FIG. 11). The cavity, specifically the portion 702 to hold a feedline, extends to component layer 604 to ensure that the feedline can contact the component layer 604. The geometry of the cavity can depend on the antenna design. For precision reasons, cutting the cavity can include laser cutting the cavity. The antenna can be small in size, and laser cutting can be particularly useful for ensuring a precise cut into the molding compound. Other means for removing the molding compound 602 to create a cavity are envisioned by the disclosure.

Figure 8:
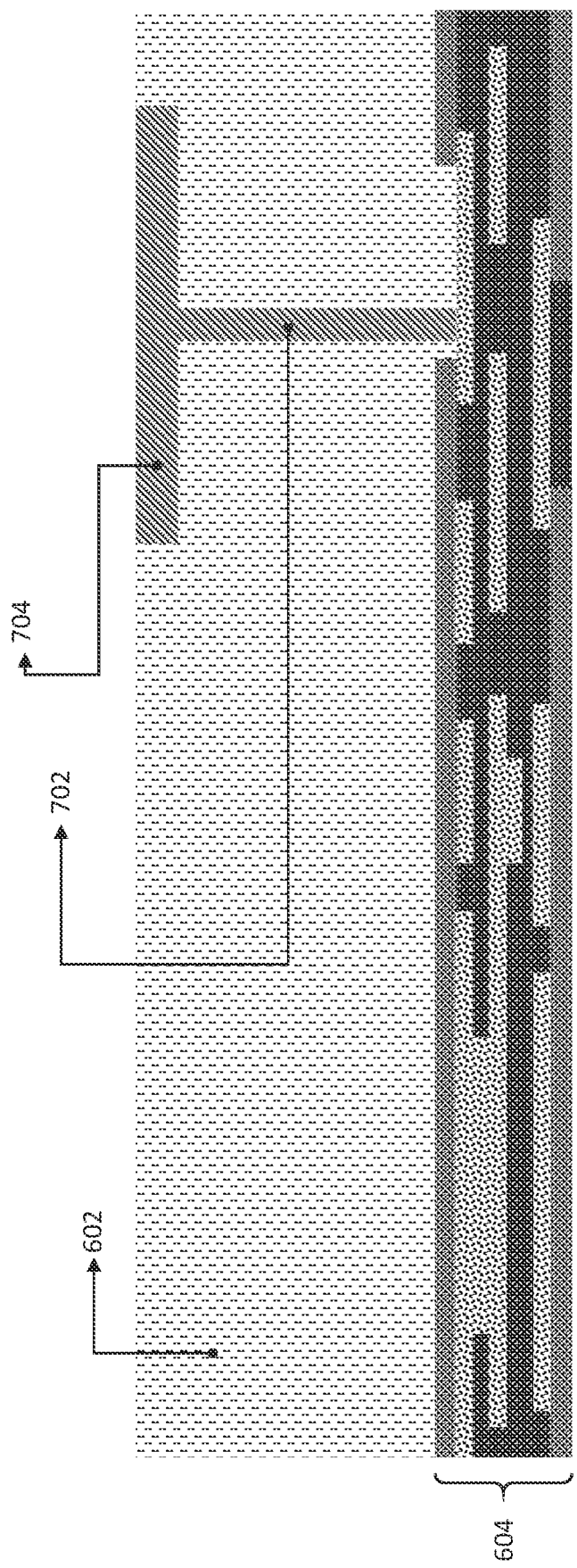

FIG. 8 shows that the cavity is filled with conductive material to form the antenna (1106 of FIG. 11). The conductive material in portion 702 can form the feedline. The conductive material in portion 704 can form the radiating structure. Filling the cavity to form the antenna can be done based on one or more methods. The same method or different methods can selected to fill different portions of the cavity. The material or parameters of the filling method being used to fill the various portions of the cavity can also differ, depending on the desired antenna design. Filling the cavity can include sputtering conductive material (e.g., copper) in at least a portion of the cavity. Sputtering can achieve a relatively thin thickness (good for making small antennae), and the density of the sputtered material is relatively low (good for keeping costs low). Accordingly, sputtering is a preferred method for filling the cavity. Filling the cavity can include trench-filling a conductive material in at least a portion of the cavity. Filling the cavity comprises depositing/applying/adhering a plate of conductive material in at least a portion of the cavity.

Figure 9:
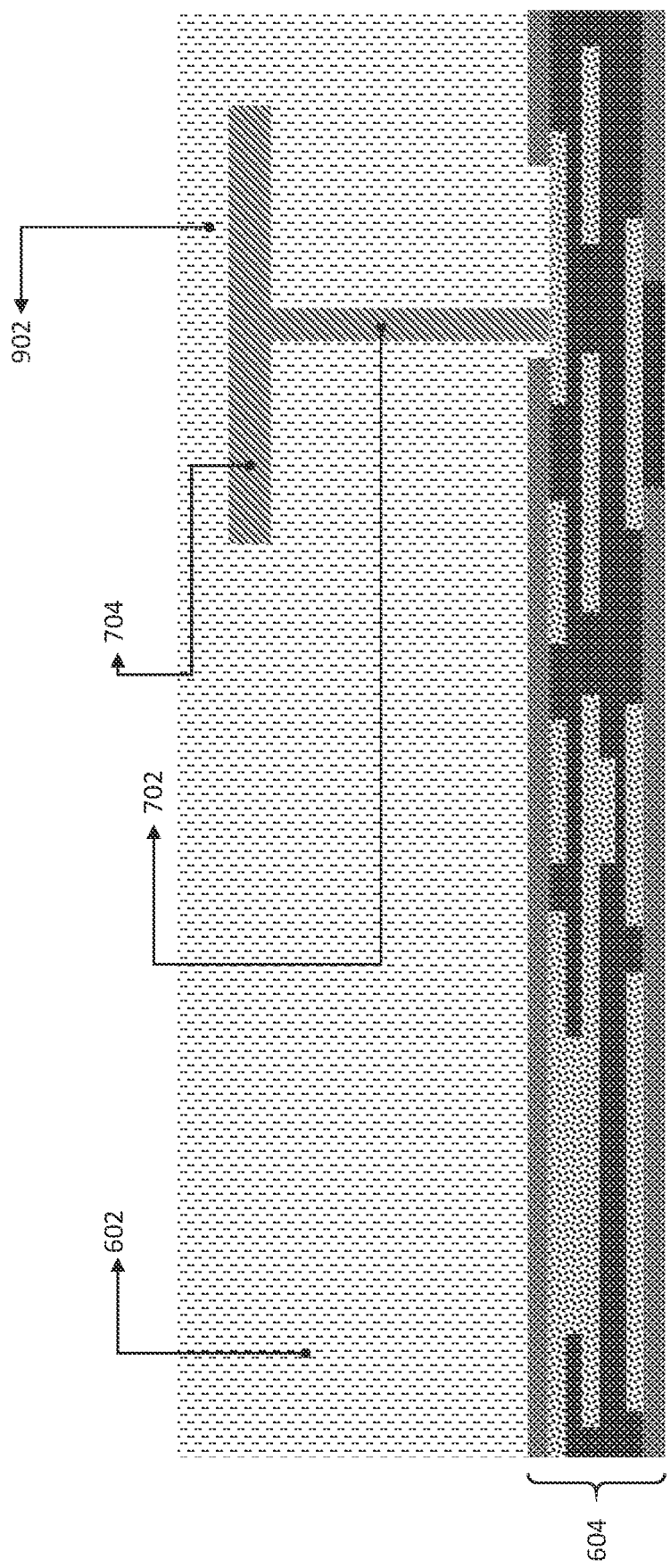

FIG. 9 shows further package molding compound 902. The further package molding compound is deposited over the antenna to enclose the antenna (1108 of FIG. 11). The partial SiP module is placed in a mold, and the further package molding compound 902 can be injected into the mold to fill the mold. Other means for depositing the further package molding compound 902 can be used. Characteristics (e.g., electrical properties) of the package molding compound 602 can differ or be the same as the characteristics of the further package molding compound 902. The characteristics of the package molding compound 602 and the package molding compound 902 can be selected to optimize antenna behavior.

Figure 10:
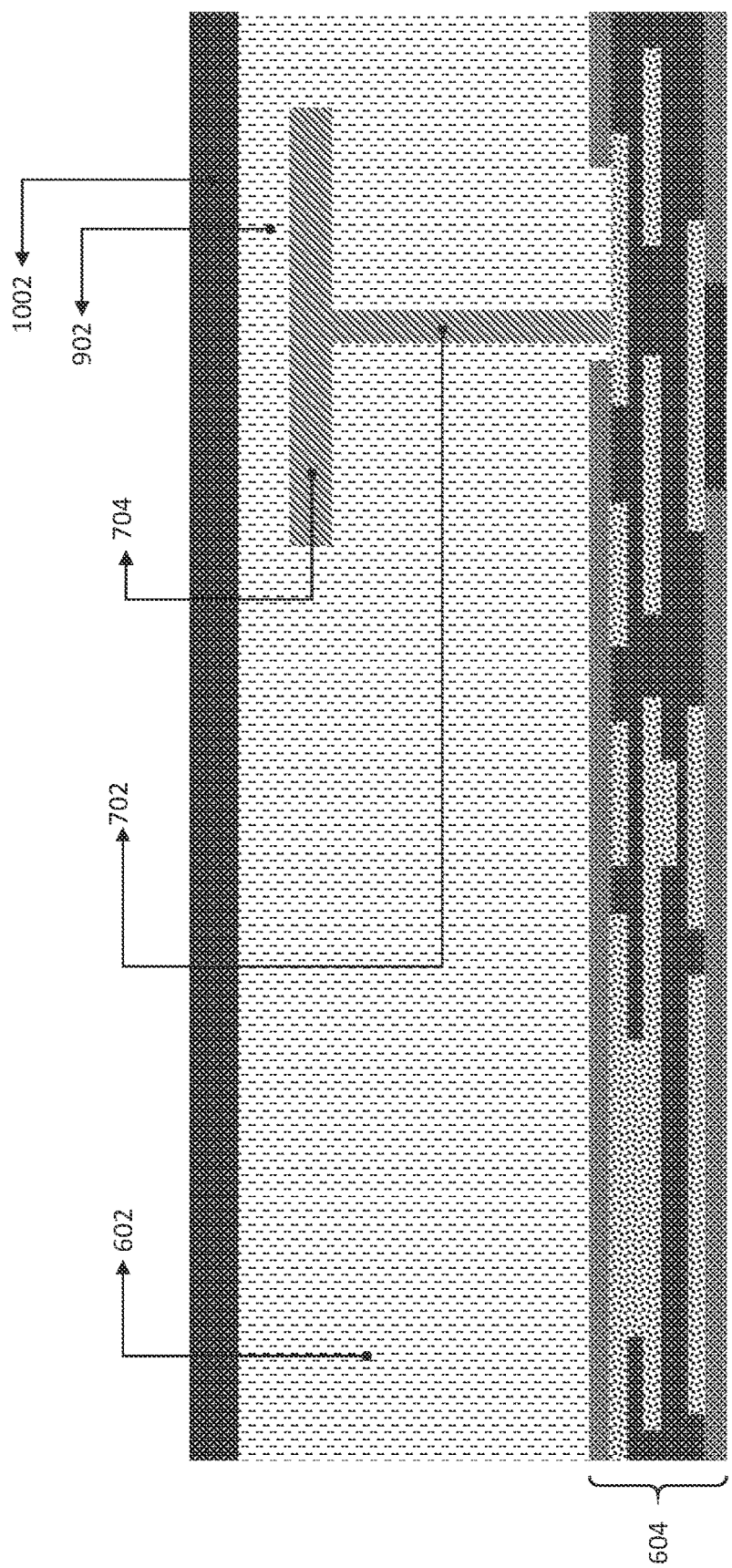
Figure 11:
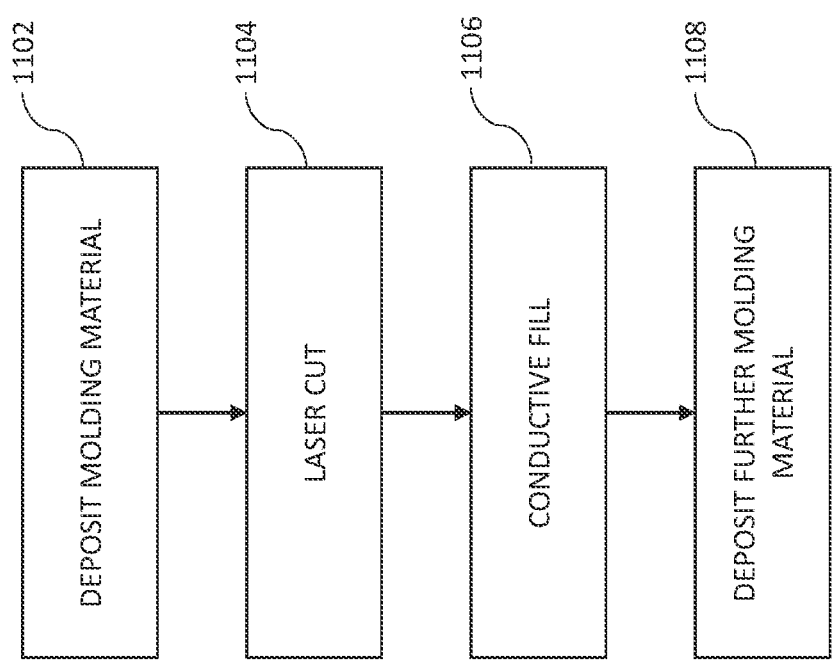
FIG. 11 is a flow diagram illustrating a method to embed an antenna, according to some embodiments of the disclosure.

FIG. 10 shows packaging enclosure material 1002. The packaging enclosure material 1002 encloses the package molding compound 602 and the further package molding compound 902. The packaging enclosure material 1002 can be plastic. The packaging enclosure material 1002 can be ceramic.

While the exemplary steps are directed to fabricating the antenna seen in FIG. 3, it is understood that the steps can also be applied to fabricating the antenna seen in FIG. 1 (with conformal overmold compound and conformal shield). The steps can include applying a conformal overmold compound onto a component layer and one or more components mounted on the component layer. Then, conformal shield material can be deposited over the conformal overmold compound. The conformal shield material can be deposited over areas of the conformal overmold compound that are not intended to contact the antenna. The package molding compound 602 can be deposited onto the conformal shield material prior to the cutting step. The cutting step for cutting the cavity that holds the antenna radiating structure and feedline can be augmented to cut through the package molding compound 602 and a further layer formed by the conformal overmold compound. The cutting does not cut through the conformal shield material to avoid having the antenna contact the conformal shield.

Exemplary Method to Embed an Antenna and Ground Structures

FIGS. 12-18 illustrate steps for to embed an antenna and ground structures, according to some embodiments of the disclosure. FIG. 19 is a flow diagram illustrating a method to embed an antenna and ground structures (including the steps illustrated in FIGS. 12-18), according to some embodiments of the disclosure. The exemplary fabrication steps being illustrated are used for fabricating the antenna with the ground structures seen in FIG. 4. The steps begin after the components have been mounted onto the component layer.

A package molding compound 602 can be deposited over one or more components mounted on the component layer 604 (not depicted) and the component layer 604 (1902 of FIG. 19), as illustrated previously in FIG. 6. The partial SiP module is placed in a mold, and the package molding compound 602 can be injected into the mold to fill the mold. Other means for depositing the package molding compound 602 can be used.

Figure 12:
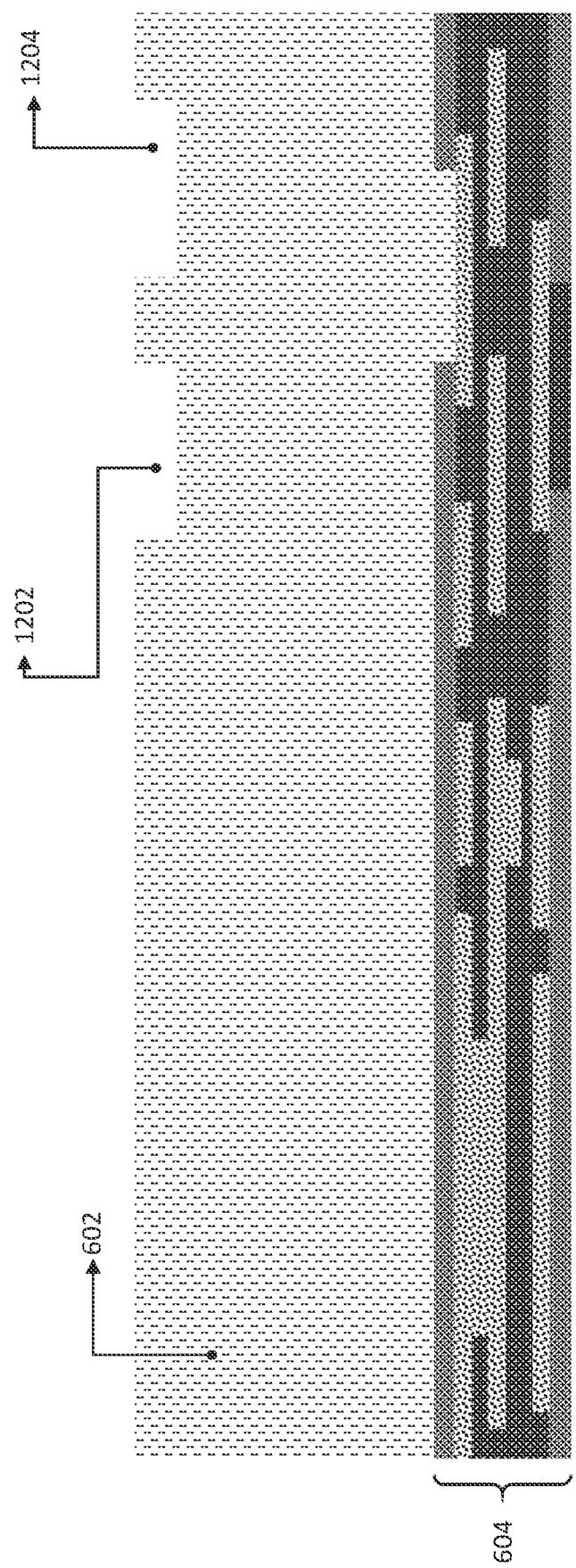
FIGS. 12-18 illustrate steps for to embed an antenna and ground structures, according to some embodiments of the disclosure.

FIG. 12 shows two cavities: cavity 1202 and cavity 1204. One or more cavities are cut in a layer formed by the molding compound 602 (1904 of FIG. 19). The one or more cavities can hold one or more ground structures for the antenna. The geometry of the one or more cavities can depend on the antenna design. For precision reasons, cutting the cavity can include laser cutting the cavity. The ground structures can be thin/small in size, and laser cutting can be particularly useful for ensuring a precise cut into the molding compound 602. Other means for removing the molding compound 602 to create the cavities are envisioned by the disclosure.

Figure 13:
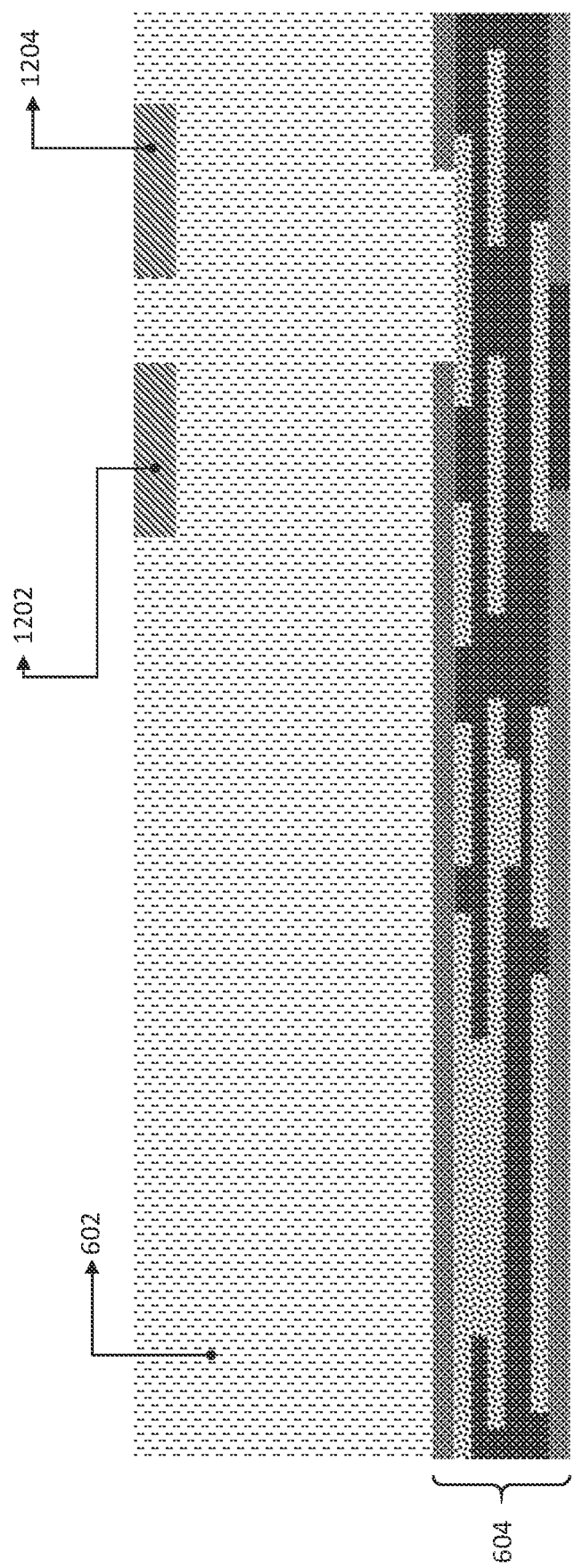

FIG. 13 shows that one or more cavities (e.g., cavity 1202 and cavity 1204) are filled with conductive material to form one or more antenna ground structures (1906 of FIG. 19). Filling the one or more cavities to form the antenna ground structures can be done based on one or more methods. The same method or different methods can be selected to fill various portions of a cavity. The same method or different methods can be selected to fill different cavities. The material or parameters of the filling method being used to fill the various portions of the cavity, or the various cavities can also differ, depending on the desired antenna design. Filling a cavity can include sputtering conductive material (e.g., copper) in at least a portion of a cavity. Sputtering can achieve a relatively thin thickness (good for making small antennae), and the density of the sputtered material is relatively low (good for keeping costs low). Accordingly, sputtering is a preferred method for filling a cavity. Filling a cavity can include trench-filling a conductive material in at least a portion of a cavity. Filling a cavity comprises depositing/applying/adhering a plate of conductive material in at least a portion of a cavity.

Figure 14:
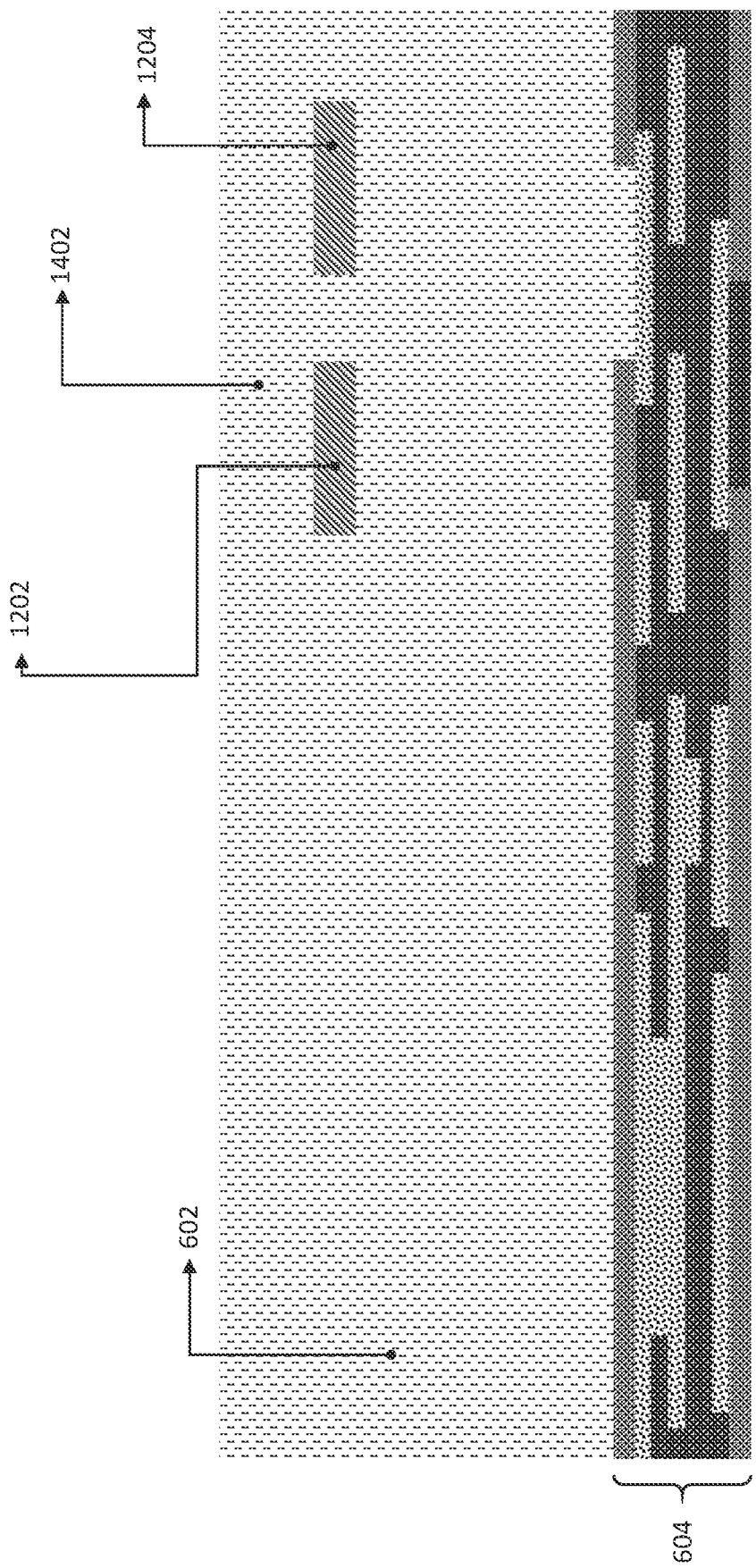

FIG. 14 shows further package molding compound 1402. The further package molding compound 1402 is deposited over the antenna ground structures (e.g., ground structures formed in cavity 1202 and in cavity 1204) to enclose the antenna ground structures (1908 of FIG. 19). The partial SiP module is placed in a mold, and the further package molding compound 1402 can be injected into the mold to fill the mold. Other means for depositing the further package molding compound 1402 can be used. Characteristics (e.g., electrical properties) of the package molding compound 602 can differ or be the same as the characteristics of the further package molding compound 1402. The characteristics of the package molding compound 602 and the further package molding compound 1402 can be selected to optimize antenna behavior.

In some alternative embodiments, the cutting step (1904 of FIG. 19) is skipped, and the ground structures are formed/deposited directly on the molding compound 602. A conductive material can be deposited/applied/plated on the molding compound 602 in certain areas to form the ground structures. Further package molding compound 1402 can be deposited over the antenna ground structures formed over the molding compound 602 and the molding compound to enclose the ground structures.

Figure 15:
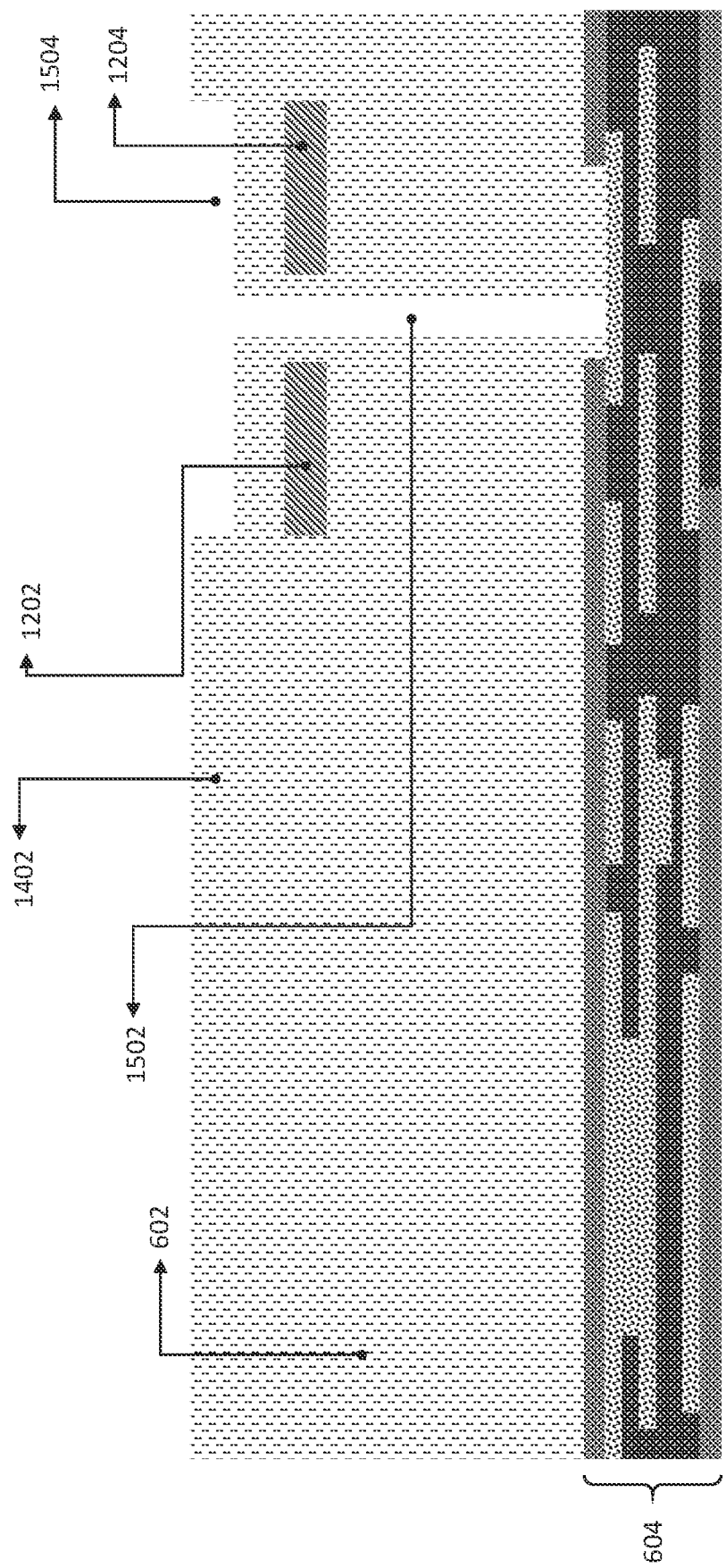

FIG. 15 shows a cavity having two portions: a portion 1502 to hold a feedline and a portion 1504 to hold a radiating structure. The cavity is cut in at least a layer formed by the package molding compound 602 and a layer formed by the further molding compound 1402 (1910 of FIG. 19). The cavity, specifically the portion 1502 to hold a feedline, extends to component layer 604, to ensure that the feedline can contact the component layer 604. The cutting does not cut through the ground structures formed in cavity 1202 and cavity 1204 since the antenna radiating structure and the antenna feedline do not contact the ground structures. The geometry of the cavity in FIG. 15 can depend on the antenna design. For precision reasons, cutting the cavity can include laser cutting the cavity. The antenna can be thin and small in size, and laser cutting can be particularly useful for ensuring a precise cut into the molding compound. Other means for removing the molding compound 603 and further molding compound 1402 to create the cavity seen in FIG. 15 are envisioned by the disclosure.

Figure 16:
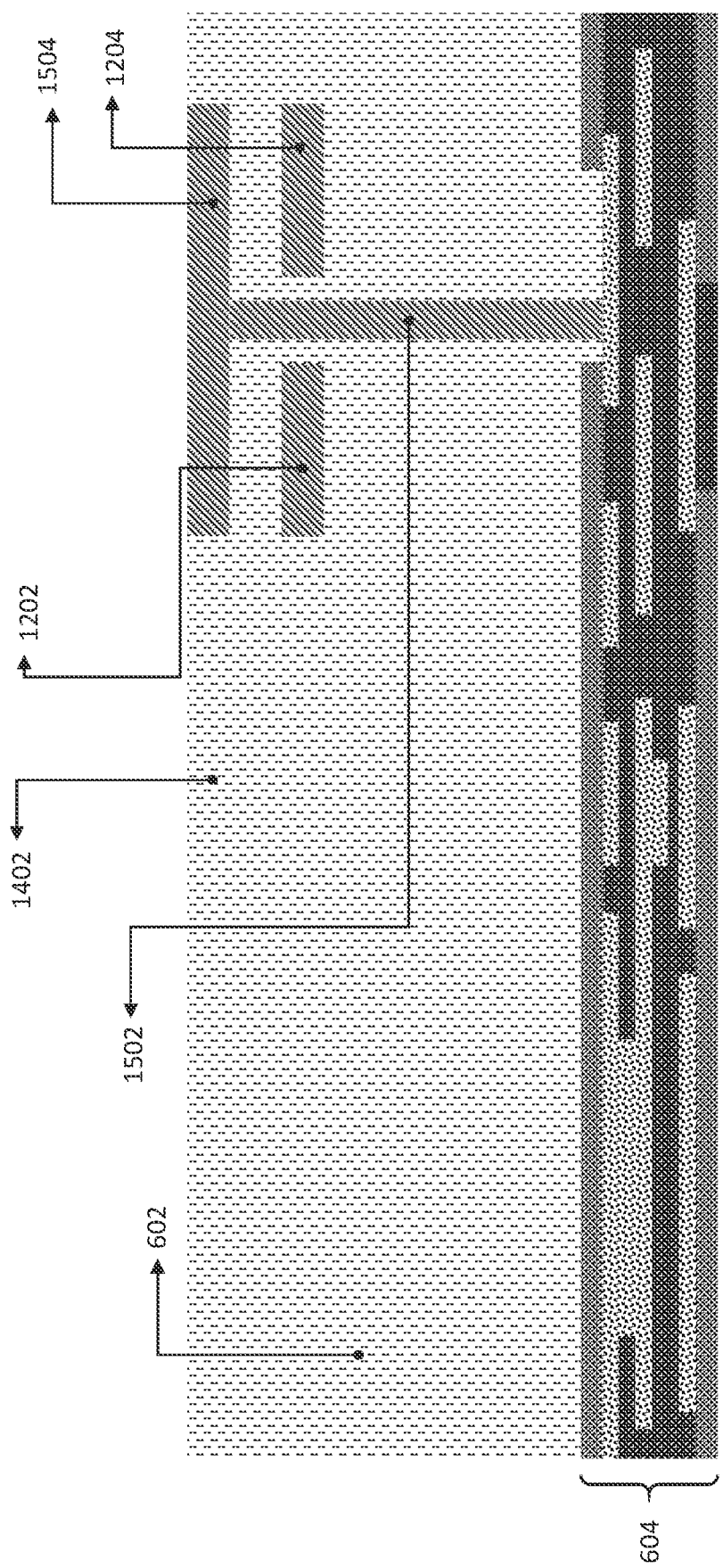

FIG. 16 shows that the cavity seen in FIG. 15 is filled with conductive material to form the antenna radiating structure in portion 1504 and the antenna feedline in portion 1502 (1912 of FIG. 19). Filling the cavity to form the antenna can be done based on one or more different methods. The same method or different methods can be selected to fill various portions of the cavity. The material or parameters of the filling method being used to fill the various portions of the cavity can also differ, depending on the desired antenna design. Filling the cavity can include sputtering conductive material (e.g., copper) in at least a portion of the cavity. Sputtering can have a relatively thin thickness (good for making small antennae), and the density of the sputtered material is relatively low (good for keeping costs low). Accordingly, sputtering is a preferred method for filling the cavity. Filling the cavity can include trench-filling a conductive material in at least a portion of the cavity. Filling the cavity comprises depositing/applying/adhering a plate of conductive material in at least a portion of the cavity.

Figure 17:
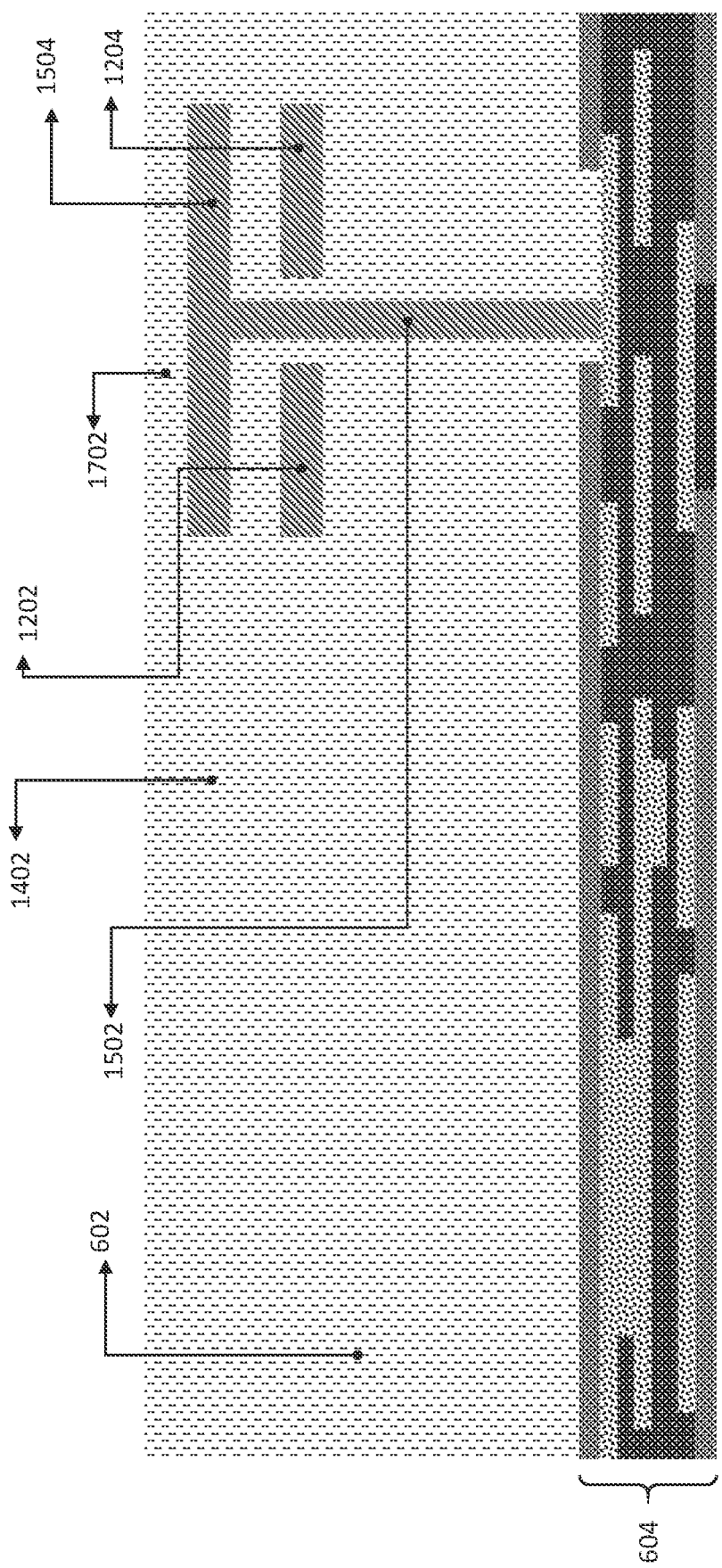

FIG. 17 shows yet further package molding compound 1702. The yet further package molding compound 1702 is deposited over the antenna to enclose the antenna (1914 of FIG. 19). The partial SiP module is placed in a mold, and the yet further package molding compound 1702 can be injected into the mold to fill the mold. Other means for depositing the further package molding compound 1702 can be used. Characteristics (e.g., electrical properties) of the package molding compound 602, characteristics of the further package molding compound 1402, and characteristics of the yet further package molding compound 1702 can differ or be the same. The various characteristics can be selected to optimize antenna behavior.

Figure 18:
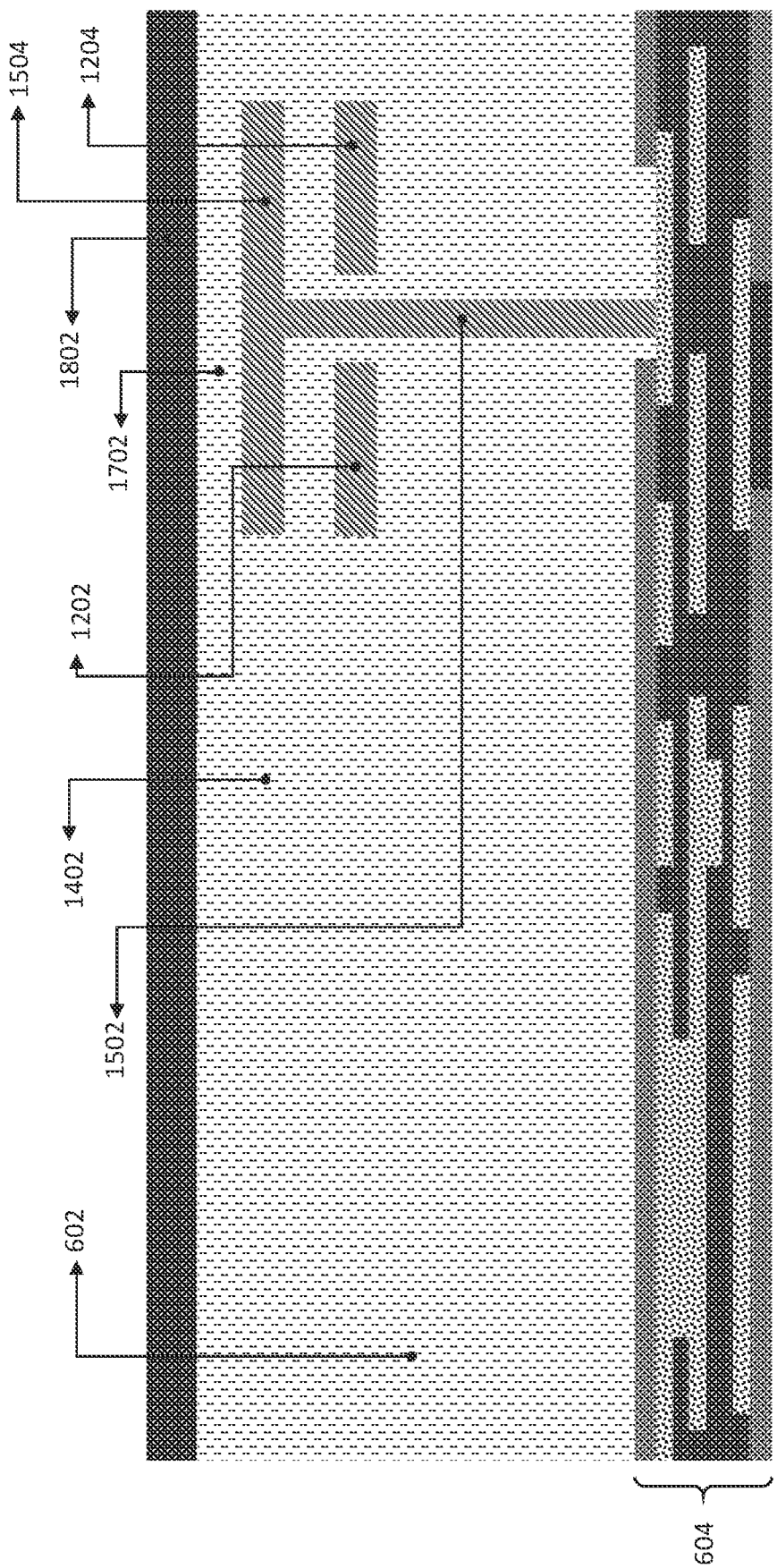
Figure 19:
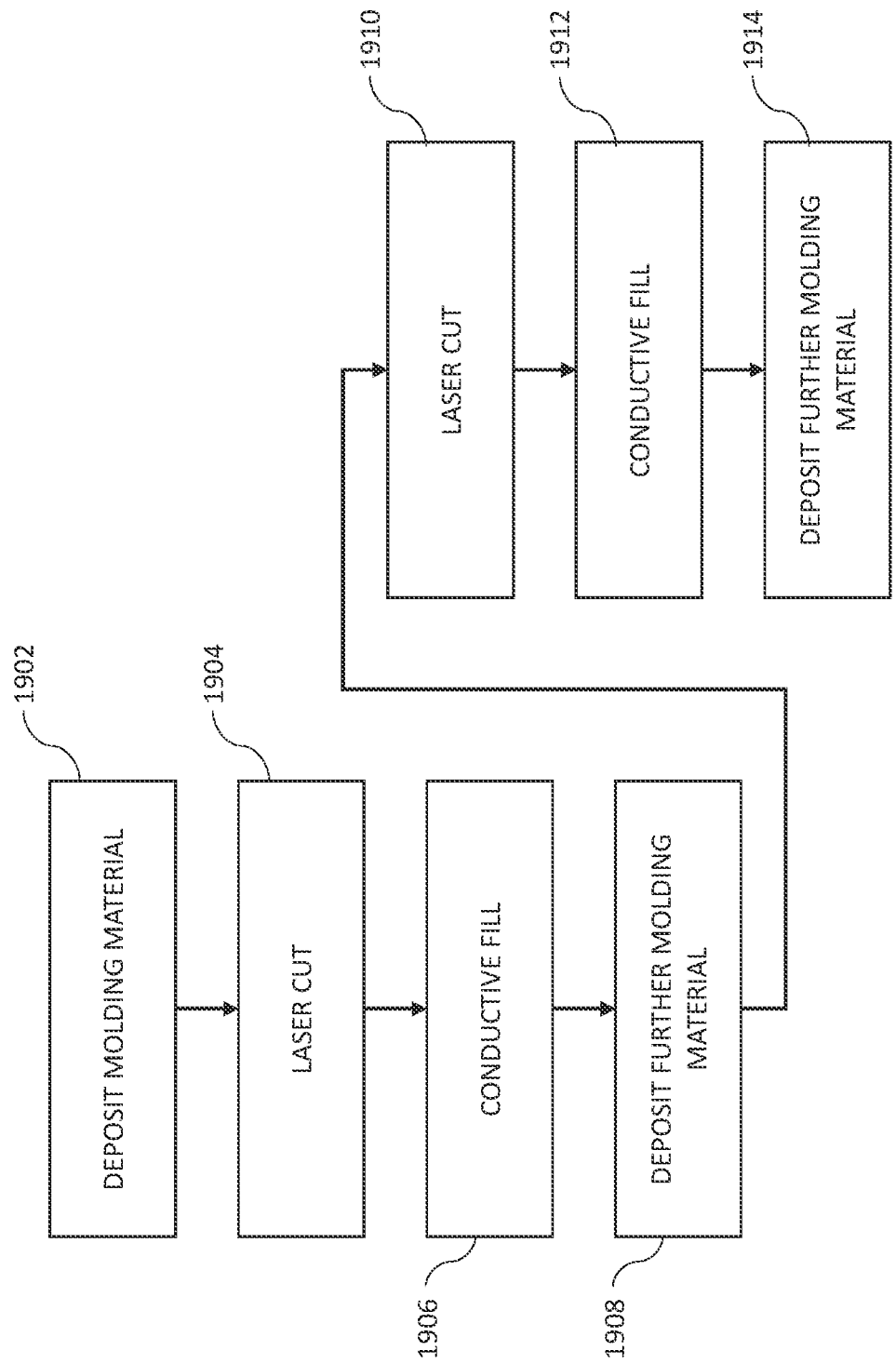
FIG. 19 is a flow diagram illustrating a method to embed an antenna and ground structures, according to some embodiments of the disclosure.

FIG. 18 shows packaging enclosure material 1802. The packaging enclosure material 1802 encloses the package molding compound 602, the further package molding compound 1402, and the yet further package molding compound 1702. The packaging enclosure material 1802 can be plastic. The packaging enclosure material 1802 can be ceramic.

While the exemplary steps are directed to fabricating the antenna seen in FIG. 4, it is understood that the steps can also be applied to fabricating the antenna seen in FIG. 2 (with conformal overmold compound and conformal shield). The steps can include applying a conformal overmold compound onto a component layer and one or more components mounted on the component layer. Then, conformal shield material can be deposited over the conformal overmold compound. The conformal shield material can be deposited over areas of the conformal overmold compound that are not intended to contact the antenna. The package molding compound 602 can be deposited onto the conformal shield material prior to the cutting step. The cutting step for cutting cavity that holds the antenna radiating structure and feedline can be augmented to cut in through the package molding compound 602, the further molding compound 1402, and a further layer formed by the conformal overmold compound.

The cutting does not cut through the conformal shield material to avoid having the antenna contact the conformal shield.

Key Advantages of the Antenna Structure within the SiP Module and Fabrication Process The resulting SiP module and fabrication process have several advantages.

Sputtering thickness can be in the sub-micrometer range. Accordingly, the antenna (both the radiating structure and the feedline) can be formed using the sputtering process to reduce cost, weight, and copper volume (when compared against a solid conductor fill method). Thus, the overall SiP fabrication cost can be reduced as well.

Since the antenna structure is already conductive, plastic packaging enclosure materials (lower cost) can be used to package the SiP module. If the antenna is not embedded in the SiP (i.e., an external antenna), a conductive material (more expensive than plastic) is typically chosen to package the SiP for proper shielding from the external antenna.

Another advantage is that the fabrication process results in an antenna that is integrated within the SiP module that saves layout space by moving the antenna into the molding compound layer. The cost of using the molding compound layer is far lower than the cost of using the component layer of a SiP.

Complexity is reduced by avoiding the need to integrate external antenna elements.

Moreover, shielding, coupling, and noise performance can be improved due to the antenna's proximity to the components of the SiP module.

Additionally, the design offers flexibility in improving antenna performance by strategically selecting specific electrical properties of molding compound deposited over the components and component layer, and the further molding compound deposited over the antenna.

The antenna can be particularly useful for mmWave applications, and the feedline can run through the molding compound to the component layer to connect the antenna to radio front-end electronics in the SiP module.

Variations, Advantages, Applications, and Examples

Example 1 is a system in package module, comprising: a substrate; a component layer; one or more components mounted on the component layer; one or more molding compound layers; and an antenna connected to the component layer and enclosed by the one or more molding compound layers.

In Example 2, the system in package module in Example 1 can optionally include the antenna comprising: a radiating structure; and a feedline connecting the radiating structure to the component layer.

In Example 3, the system in package module in Example 2 can optionally include the radiating structure being enclosed within one of the molding compound layers.

In Example 4, the system in package module in Example 2 or 3 can optionally include the radiating structure further comprising: one or more parasitic conductive elements extending from the radiating structure.

In Example 5, the system in package module in any one of Examples 2-4 can optionally include the radiating structure further comprising: one or more parasitic conductive elements adjacent to the radiating structure.

In Example 6, the system in package module in any one of Examples 1-5 can optionally include one or more antenna ground structures enclosed in one of the molding compound layers.

In Example 7, the system in package module in Example 6 can optionally include the one or more antenna ground structures comprises one or more defected ground structures.

In Example 8, the system in package module in any one of Examples 1-6 can optionally include: the antenna comprising two radiating structures forming a dipole antenna.

In Example 9, the system in package module in any one of Examples 1-7 can optionally include the antenna comprising: four radiating structures forming a quadrupole antenna.

Example 10 is a method to embed an antenna in a system in package module, comprising: cutting a cavity in at least a layer formed by a package molding compound, wherein the cavity extends to a component layer; filling the cavity with conductive material to form an antenna; and depositing further package molding compound over the antenna.

In Example 11, the method in Example 10 can optionally include: depositing the package molding compound onto the component layer and one or more components mounted on the component layer prior to the cutting step.

In Example 12, the method in Example 10 or 11 can optionally include applying a conformal overmold compound onto a component layer and one or more components mounted on the component layer; depositing conformal shield material over the conformal overmold compound; and depositing the package molding compound onto the conformal shield material prior to the cutting step; wherein cutting the cavity further cuts in a further layer formed by the conformal overmold compound.

In Example 13, the method in any one of Examples 10-12 can optionally include enclosing the package molding compound and further package molding compound with packaging enclosure material.

In Example 14, the method in any one of Examples 10-13 can optionally include cutting the cavity comprises laser cutting the cavity.

In Example 15, the method in any one of Examples 10-14 can optionally include the cavity comprising a portion to hold a feedline and a portion to hold a radiating structure. In Example 16, the method in any one of Examples 10-15 can optionally include filling the cavity comprising sputtering conductive material in at least a portion of the cavity.

In Example 17, the method in any one of Examples 10-16 can optionally include filling the cavity comprising trench-filling a conductive material in at least a portion of the cavity.

In Example 18, the method in any one of Examples 10-17 can optionally include filling the cavity comprising depositing a plate of conductive material in at least a portion of the cavity.

Example 19 is a method to embed an antenna in a system in package module, comprising: depositing molding compound; cutting one or more cavities in a layer formed by the molding compound; filling the one or more cavities with conductive material to form one or more antenna ground structures; and depositing further molding compound over the one or more antenna ground structures.

In Example 20, the method of Example 19 can optionally include: cutting a further cavity in at least the layer formed by the molding compound and a layer formed by the further molding compound, wherein the further cavity extends to a component layer; filling the further cavity with conductive material to form an antenna radiating structure and an antenna feedline; and depositing yet further molding compound over the antenna.

Example 21 is a method to embed an antenna in a system in package module, comprising: depositing molding compound; depositing conductive material onto the molding compound to form one or more antenna ground structures; and depositing further molding compound over molding compound and the one or more antenna ground structures deposited thereon.

In Example 22, the method of Example 21 can optionally include: cutting a further cavity in at least the layer formed by the molding compound and a layer formed by the further molding compound, wherein the further cavity extends to a component layer; filling the further cavity with conductive material to form an antenna radiating structure and an antenna feedline; and depositing yet further molding compound over the antenna.

As illustrated by FIGS. 1-4, the antennae seen in SiP modules 100, 200, 300, and 400 are not co-planar with the one or more components mounted on the component layer 108. The antennae are also not embedded in the component layer 108. The antennae are also not placed external to or above the molding compound 120 and packaging enclosure material 128 with a feedline running through the molding compound 120. The antennae are also not placed external to or above the molding compound 220 and packaging enclosure material 228 with a feedline running through the molding compound 220.

SiP modules referenced herein can encompass modules which stacks components vertically and/or horizontally. Accordingly, SiP modules can also include (less dense) multi-chip modules (MCM) that places dies horizontally only. The antenna and ground structures can still be embedded in the molding compound layer of an MCM using techniques described herein.

While the examples show just one antenna, it is appreciated by the present disclosure that more than one antenna can be embedded in a SiP module, e.g., to form an array of antennae. One or more antennae can be used for transmitting signals. One or more antennae can be used for receiving signals. An array of antennae can be used for beamforming.

The present disclosure includes apparatuses which can include means to implement any one or more parts of the various techniques disclosed herein.

It is also imperative to note that all of the specifications, dimensions, and relationships outlined herein (e.g., circuit components) have only been offered for purposes of example and teaching only. Such information may be varied considerably without departing from the spirit of the present disclosure, or the scope of the appended claims (if any) and/or examples. The specifications apply only to one non-limiting example and, accordingly, they should be construed as such. In the foregoing description, example embodiments have been described with reference to particular component arrangements. Various modifications and changes may be made to such embodiments without departing from the scope of the appended claims (if any) and/or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Some of the disclosed functions may be deleted or removed where appropriate, or these operations may be modified or changed considerably without departing from the scope of the present disclosure. In addition, the timing of these operations may be altered considerably. The operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure. Note that all optional features of the apparatus described herein may also be implemented with respect to the method or process described herein and specifics in the examples may be used anywhere in one or more embodiments.

What is claimed is:

1. A method to embed an antenna in a system in package module, comprising:
   cutting a cavity to hold a feedline and a radiating structure, wherein at least a portion of the cavity is in a layer formed by a package molding compound and the cavity extends to a component layer;
   filling the cavity with conductive material to form an antenna having the feedline and the radiating structure; and
   depositing further package molding compound over the antenna.

2. The method of claim 1, further comprising:
   depositing the package molding compound onto the component layer and one or more components mounted on the component layer prior to cutting the cavity.

3. The method of claim 1, further comprising:
   applying a conformal overmold compound onto a component layer and one or more components mounted on the component layer;
   depositing conformal shield material over the conformal overmold compound; and
   depositing the package molding compound onto the conformal shield material prior to cutting the cavity;
   wherein at least a portion of the cavity is in a further layer formed by the conformal overmold compound.

4. The method of claim 3, wherein the antenna formed in the cavity does not contact the conformal shield material.

5. The method of claim 1, further comprising:
enclosing the package molding compound and further package molding compound with packaging enclosure material.

6. The method of claim 1, wherein:
cutting the cavity comprises laser cutting the cavity.

7. The method of claim 1, wherein filling the cavity comprises sputtering the conductive material in at least a portion of the cavity.

8. The method of claim 1, wherein filling the cavity comprises trench-filling the conductive material in at least a portion of the cavity.

9. The method of claim 1, wherein filling the cavity comprises depositing a plate of the conductive material in at least a portion of the cavity.

10. The method of claim 1, wherein:
prior to cutting the cavity, components are on the component layer;
the components comprise passive components and a chip; and
the component layer comprises one or more metal layers with electrical interconnections for the components on the component layer.

11. The method of claim 1, wherein the conductive material comprises copper.

12. The method of claim 1, wherein the radiating structure forms a patch antenna.

13. The method of claim 1, wherein the antenna comprises a second radiating structure.

14. The method of claim 1, wherein the radiating structure comprises parasitic conductive elements.

15. The method of claim 1, wherein the antenna is configured for millimeter wave applications.

16. The method of claim 1, wherein filling the cavity comprises forming the radiating structure over and spaced apart from one or more antenna ground structures, and the one or more antenna ground structures are closer to the component layer than the radiating structure.

17. The method of claim 16, wherein the one or more antenna ground structures comprise one or more defected ground structures.

18. The method of claim 1, wherein the antenna is included in an array of antennae over the component layer, and the array of antennae is configured to perform beamforming.

19. A method to suspend an antenna in a system in package module, comprising:
depositing molding compound;
laser cutting a cavity to hold a feedline and a radiating structure, wherein a portion of the cavity is in a layer formed by the molding compound, and the cavity extends to a component layer;
sputtering conductive material into the cavity to form an antenna; and
depositing further molding compound over the antenna.

20. The method of claim 19, further comprising:
prior to depositing the molding compound, plating conductive material onto a surface of a molding compound layer formed over the component layer to form one or more ground structures.

* * * * *